(12) United States Patent
Smiles

(10) Patent No.: US 12,648,098 B1
(45) Date of Patent: Jun. 2, 2026

(54) RETRO-STYLED MOBILE DEVICE VIDEO PRODUCTION PLATFORM WITH INTEGRATED STORAGE

(71) Applicant: John Michael Smiles, South Burlington, VT (US)

(72) Inventor: John Michael Smiles, South Burlington, VT (US)

( * ) Notice: Subject to any disclaimer, the term of this patent is extended or adjusted under 35 U.S.C. 154(b) by 0 days.

(21) Appl. No.: 19/298,654

(22) Filed: Aug. 13, 2025

Related U.S. Application Data

(60) Provisional application No. 63/683,677, filed on Aug. 15, 2024.

(51) Int. Cl.
| | |
|---|---|
| *H05K 5/02* | (2006.01) |
| *G06F 1/16* | (2006.01) |
| *H04N 23/51* | (2023.01) |

(52) U.S. Cl.
CPC ......... H05K 5/0243 (2013.01); G06F 1/1632 (2013.01); H04N 23/51 (2023.01); H05K 5/0204 (2013.01)

(58) Field of Classification Search
CPC .............................. G06F 1/1628; G06F 1/1632
See application file for complete search history.

(56) References Cited

U.S. PATENT DOCUMENTS

| | | | | |
|---|---|---|---|---|
| 2,560,884 A | * | 7/1951 | Nagourney | A61B 5/0088 |
| | | | | 74/504 |
| 4,392,183 A | * | 7/1983 | Ostlund | G03B 15/03 |
| | | | | 362/17 |
| 4,687,309 A | * | 8/1987 | Breslau | F16M 11/28 |
| | | | | 396/423 |
| 8,738,080 B2 | * | 5/2014 | Nhiayi | H04N 23/51 |
| | | | | 348/42 |
| 8,989,826 B1 | * | 3/2015 | Connolly | A45C 11/00 |
| | | | | 455/575.8 |
| 9,722,656 B2 | * | 8/2017 | McDonald | H04N 5/772 |
| 10,178,209 B1 | * | 1/2019 | Hesse | H04N 23/54 |
| 10,261,395 B2 | * | 4/2019 | Benvenuti | G03B 17/08 |
| 10,579,108 B2 | * | 3/2020 | Dilaura | A45C 13/002 |

(Continued)

*Primary Examiner* — Adrian S Wilson
(74) *Attorney, Agent, or Firm* — QuickPatents; Kevin Prince

(57) ABSTRACT

This invention is a camera accessory and storage system for smartphones consisting of a container resembling a vintage camera with internal storage space accessible via a pivotally attached door. The container features multiple mounting points, a built-in power source with charging ports, a smartphone mounting bracket, and a tripod mount. The system includes a microphone mount and accommodates various accessories such as a reel-to-reel magazine container with integrated Bluetooth speakers, detachable lens hood with embedded short-throw projector, and tablet mount. Multiple mounting point types include cold shoe mounts, threaded holes, clamp mechanisms, magnetic attachment points, and dovetail slots for attaching accessories like prop lenses, flags, and handles. The system accommodates various camera types including smartphones, GoPro and MeVo cameras, supports interchangeable branded panels with magnetic signage, houses a portable printer, and includes video booth functionality through an attachable touchscreen monitor for self-serve recording applications.

20 Claims, 6 Drawing Sheets

(56)  References Cited

U.S. PATENT DOCUMENTS

| | | | | |
|---|---|---|---|---|
| 10,627,706 | B2 * | 4/2020 | Basulto | H04N 23/52 |
| 10,667,696 | B1 * | 6/2020 | Le | G03B 15/07 |
| 11,009,775 | B2 * | 5/2021 | Le | A61B 1/00128 |
| 11,899,345 | B1 * | 2/2024 | Sabin | G03B 17/565 |
| 2010/0182475 | A1 * | 7/2010 | Witte | G02B 27/025 |
| | | | | 348/308 |
| 2011/0287808 | A1 * | 11/2011 | Huang | G06F 1/1632 |
| | | | | 455/557 |
| 2012/0320340 | A1 * | 12/2012 | Coleman, III | A61B 3/10 |
| | | | | 351/208 |
| 2013/0005401 | A1 * | 1/2013 | Rosenhan | H04M 1/724092 |
| | | | | 455/557 |
| 2014/0132781 | A1 * | 5/2014 | Adams | H04N 23/663 |
| | | | | 348/207.1 |
| 2014/0179372 | A1 * | 6/2014 | Zajeski | G09G 5/003 |
| | | | | 455/557 |
| 2014/0267891 | A1 * | 9/2014 | Adams | H04N 23/55 |
| | | | | 348/373 |
| 2015/0156297 | A1 * | 6/2015 | Crawford | H02J 50/10 |
| | | | | 455/26.1 |
| 2016/0183393 | A1 * | 6/2016 | Groom | H05K 5/0086 |
| | | | | 248/452 |
| 2016/0202598 | A1 * | 7/2016 | Griffey | G03B 17/566 |
| | | | | 396/428 |
| 2016/0277660 | A1 * | 9/2016 | Kaiser | H04N 23/56 |
| 2016/0373156 | A1 * | 12/2016 | McDonald | H04N 23/62 |
| 2020/0301251 | A1 * | 9/2020 | Le | A61B 1/0623 |
| 2021/0076794 | A1 * | 3/2021 | Benezri | A45C 3/00 |
| 2022/0109748 | A1 * | 4/2022 | Berlin | G06F 1/1632 |
| 2022/0137491 | A1 * | 5/2022 | Stankie | H04M 1/724092 |
| | | | | 396/428 |
| 2022/0374043 | A1 * | 11/2022 | Lee | H04B 1/3877 |
| 2023/0209199 | A1 * | 6/2023 | Chen | F16M 11/123 |

* cited by examiner

RETRO-STYLED MOBILE DEVICE VIDEO PRODUCTION PLATFORM WITH INTEGRATED STORAGE

CROSS REFERENCE TO RELATED APPLICATIONS

This application claims the benefit of U.S. Provisional Patent Application 63/683,677, filed on Aug. 15, 2024, and incorporated herein by reference.

STATEMENT REGARDING FEDERALLY SPONSORED RESEARCH AND DEVELOPMENT

Not Applicable.

FIELD OF THE INVENTION

This invention relates to video production, and more particularly to a multi-functional smartphone video production case.

BACKGROUND

Interviewing people with electronic communication devices has become a popular method for capturing and sharing experiences, such as with VLOGs or the like. However, people often become distracted or untrusting when being recorded with ubiquitous handheld devices, such as a lone smartphone. In contrast, people tend to respond positively to iconic cameras such as vintage motion picture cameras, television broadcast cameras, and professional equipment that differ significantly from conventional handheld devices.

Traditionally, people capture videos or pictures by holding an electronic communication device such as an iPhone® in their hand or securing it to a telescopic pole, allowing them to extend the camera to a desired position. Some use remote microphone devices with Bluetooth® connectivity to improve audio quality when recording at a distance from the tripod and camera. Lighting accessories powered by batteries are often employed to enhance picture quality. However, these various components typically require separate storage containers and may be difficult to use simultaneously without multiple operators.

Currently, people capturing videos and pictures using their electronic communication devices lack a unified storage container to house, power, and organize vlogging equipment such as lights, microphones, and Bluetooth® printers. Conventional storage containers are not designed to provide a platform for attaching remote microphone receivers, lighting apparatus, and electronic communication devices. Furthermore, existing cases are not designed with cleats or adapters to accommodate configurations that draw attention to the handheld device or camera.

The growing demand for interactive entertainment features such as karaoke functionality and PA capabilities in mobile recording setups has created additional challenges for content creators. Traditional mobile recording systems lack integrated audio amplification and projection capabilities needed for engaging audiences during live performances or presentations. Additionally, the trend toward self-serve video recording applications, such as video booths at events, requires specialized equipment that can operate independently while maintaining professional appearance and functionality.

Such conventional methods and devices do not provide an easy way to attract the attention and trust of interviewees, nor can they be configured to resemble professional cameras and iconic Hollywood cameras recognized by people as having a visual identity that evokes attention. People capturing videos and pictures using their electronic communications devices lack a unified storage container to house, power, and organize vlogging equipment (lights, microphones, Bluetooth® printer, etc.).

A needed invention would address these issues by providing a unified storage system that resembles professional camera equipment, houses and powers various accessories, and attracts the attention and trust of interviewees. Such a system would need to be configurable to resemble iconic cameras, provide multiple mounting options for accessories, include an internal power source, and offer versatility in its use across different recording scenarios. An ideal solution would combine storage, power, and aesthetic elements in a single device, solving the problems of disjointed equipment, lack of attention-grabbing features, and the need for a professional appearance in mobile videography. Furthermore, it would enhance the functionality of smartphones by transforming them into professional-looking camera setups, thereby bridging the gap between consumer devices and professional equipment in a compact, versatile package. This type of invention could revolutionize mobile videography by addressing the current limitations and providing a comprehensive solution for content creators, journalists, and enthusiasts alike. The present invention accomplishes these objectives.

SUMMARY OF THE INVENTION

The invention is a camera accessory and storage system designed for use with smartphones, also known as a "Tell-A-Box." It comprises a container resembling a vintage camera, which serves as both a functional storage unit and a platform for mobile videography.

The container includes a pivotally attached door providing access to an internal storage space. Multiple mounting points are fixed to the container, allowing for the attachment of various accessories. A power source within the storage space connects to charging ports, enabling the powering and charging of the smartphone and other devices.

A mounting bracket projects from the container to hold the smartphone securely. A tripod mount on a bottom of the container allows for stable positioning. The system includes a microphone mount for attaching audio recording devices.

Optional accessories include a removable reel-to-reel magazine container, a microphone resembling a classic newscaster microphone, a detachable lens hood, and a tablet mount for teleprompter and other functionality. The reel-to-reel magazine container includes integrated Bluetooth speakers for enhanced audio output during karaoke and PA applications. A short-throw projector embedded in the lens area provides visual display capabilities for karaoke lyrics and video content. The system can accommodate interchangeable branded panels, LED lighting accessories, and a portable printer.

Various types of mounting points are available, including cold shoe mounts, threaded holes, clamp mechanisms, magnetic attachment points, and dovetail slots. These allow for the attachment of additional accessories such as prop lenses, flags, and handles. Enhanced magnetic attachment points accommodate various camera types including GoPro and MeVo cameras, as well as quick-attach accessories such as microphones, LED lights, and prop lenses. Magnetic signage capabilities allow for rapid customization and branding changes.

The system is designed to be versatile, suitable for a range of applications from amateur vlogging to professional video production. It combines a vintage aesthetic with modern functionality, allowing users to transform their smartphones into professional-looking camera setups while providing storage and power solutions. The system supports video booth functionality through an attachable touchscreen monitor and camera for self-serve recording applications.

Key features include its compact design, ability to accept standard camera accessories, and customization options through interchangeable panels. The system also supports auxiliary functions such as Karaoke and instant photo printing.

Overall, the invention aims to provide a comprehensive, portable solution for mobile videography that enhances the capabilities of smartphone cameras while offering a unique, attention-grabbing appearance.

The present invention addresses these issues by providing a unified storage system that resembles professional camera equipment, houses and powers various accessories, and attracts the attention and trust of interviewees. This system is configurable to resemble iconic cameras, provides multiple mounting options for accessories, includes an internal power source, and offers versatility in its use across different recording scenarios. By combining storage, power, and aesthetic elements in a single device, the invention solves the problems of disjointed equipment, lack of attention-grabbing features, and the need for a professional appearance in mobile videography. Furthermore, it enhances the functionality of smartphones by transforming them, via the six sides of the container, into professional-looking camera setups, thereby bridging the gap between consumer devices and professional equipment in a compact, versatile package. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Figure 1:
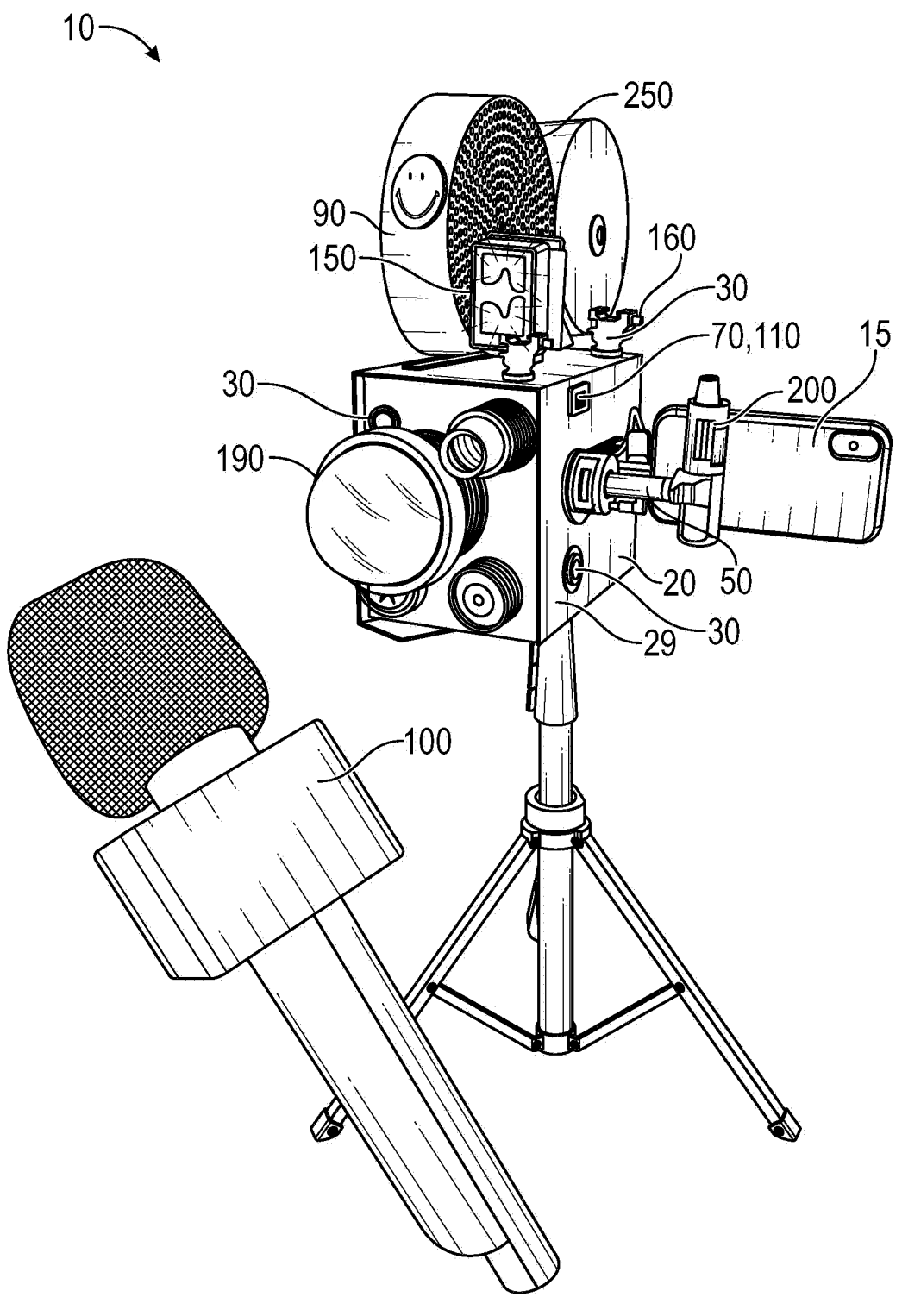
FIG. 1 is a front perspective view of the invention.
Figure 2:
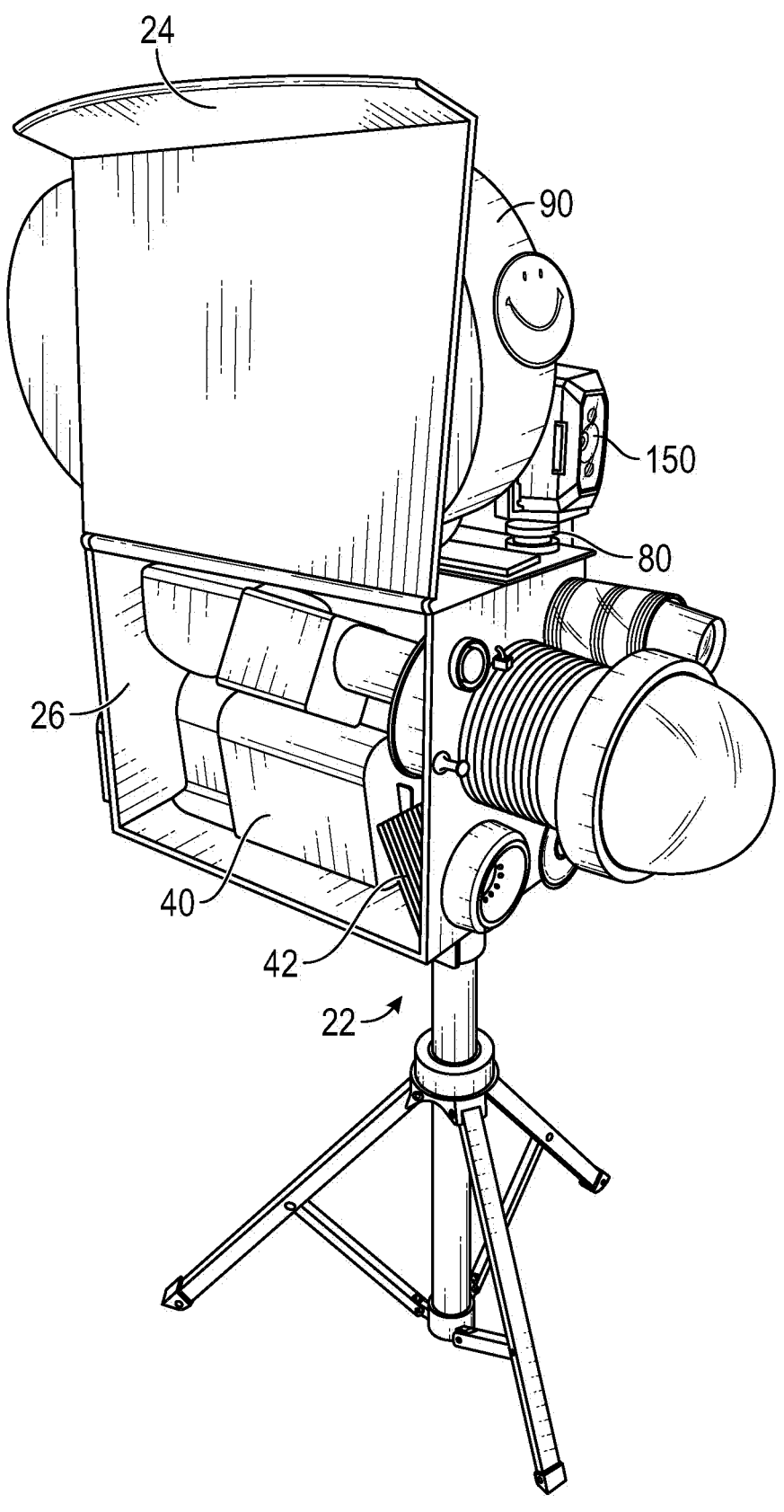
FIG. 2 is a left-side perspective view of the invention, illustrating a storage space within a container.
Figure 3:
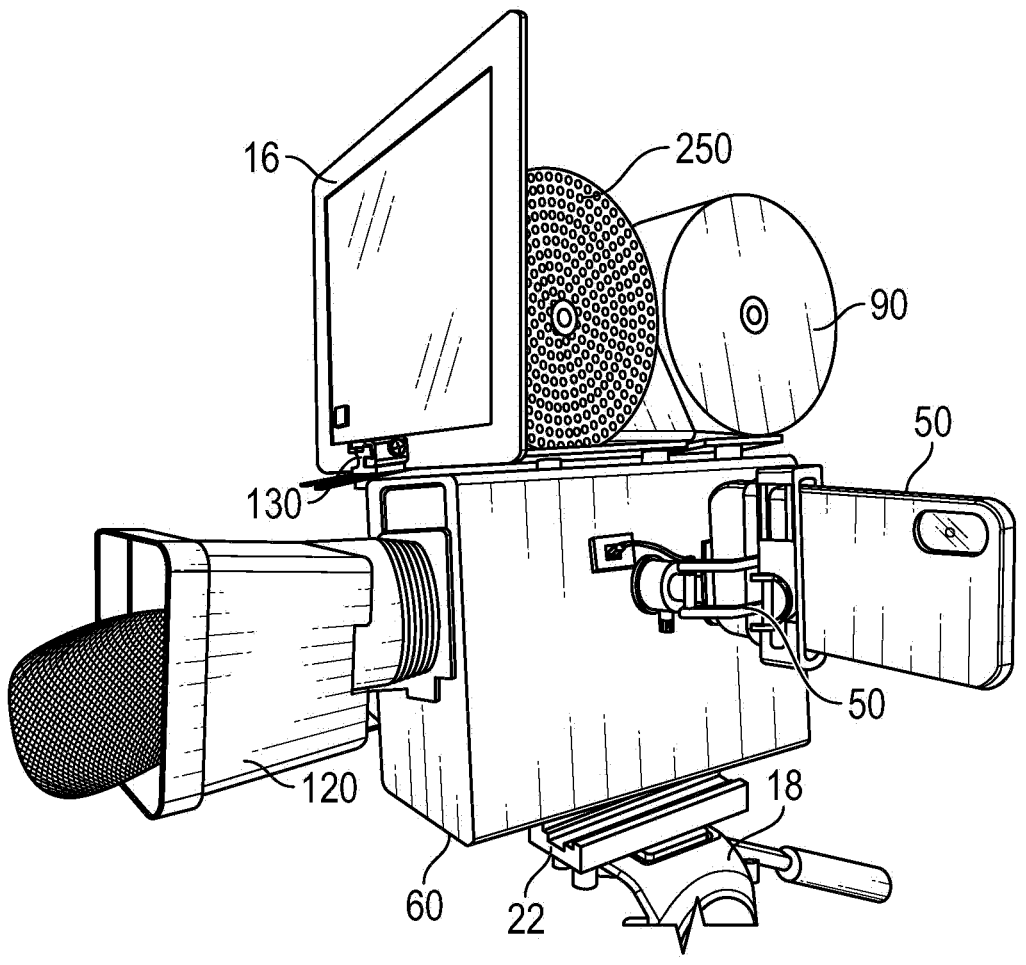
FIG. 3 is a partial right-side perspective view of the invention.
Figure 6:
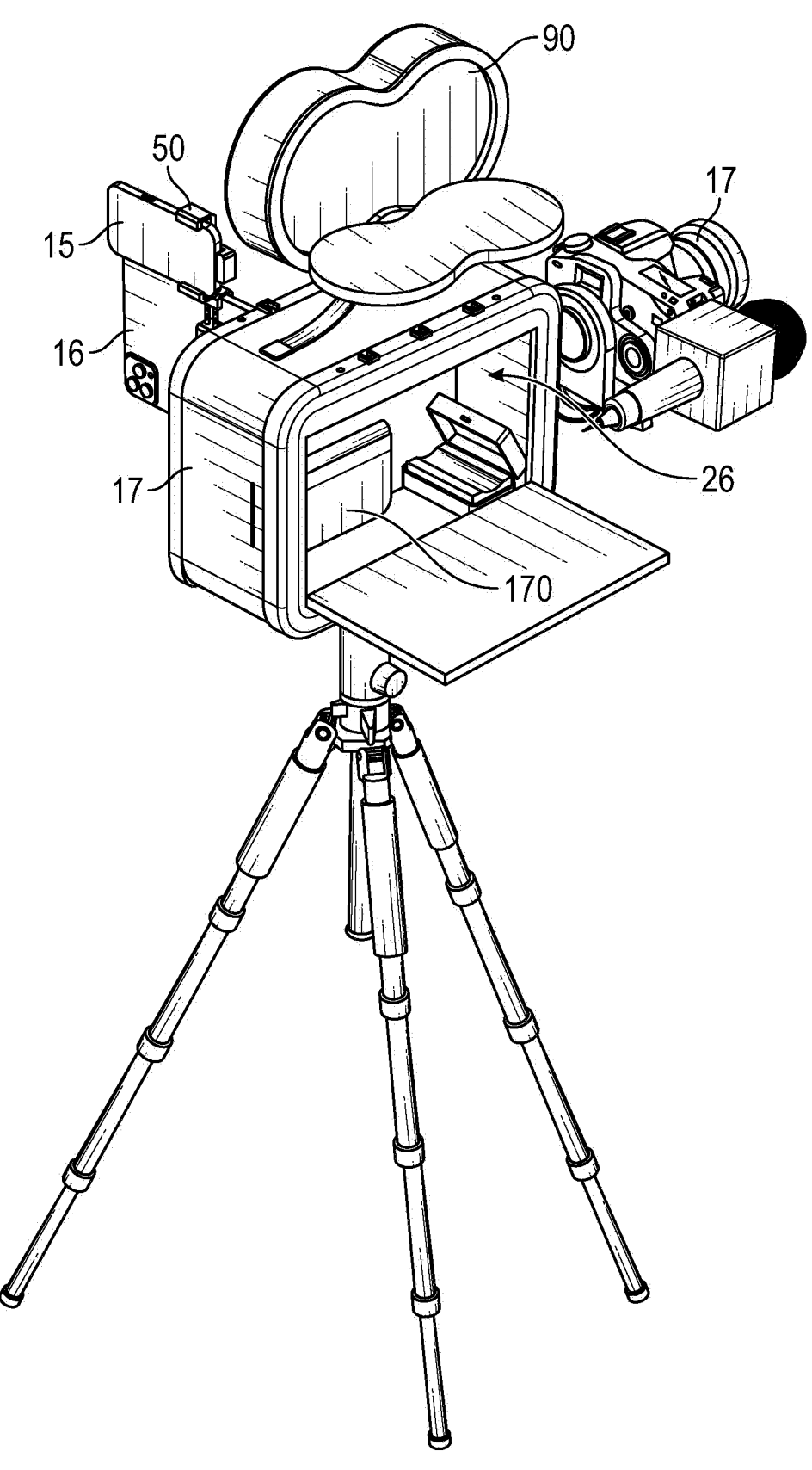
FIG. 6 is a rear perspective view of the invention, illustrating an embodiment configured for holding a 35 mm camera and other accessories.

FIGS. 1-3 illustrate a camera accessory and storage system 10, also known as "Tell-A-Box," designed for use with a smartphone 15 and/or at least one tablet device 16 and/or at least one 35 mm camera. The system comprises a container 20 that resembles a camera, providing both a vintage aesthetic and practical functionality. The container 20 is made of a safe, fire-retardant material, ensuring durability and safety during use. The container 20 includes at least one door 24 pivotally attached to it, allowing access to a storage space 26 (FIG. 6) within the container 20. This storage space 26 houses various accessories and equipment needed for mobile videography, such as auxiliary SSD storage devices, printers, battery backup devices, or the like.

Fixed to the container 20 are a plurality of mounting points 30. These mounting points 30 are versatile and allow for the attachment of various accessories, enhancing the system's functionality. Within the storage space 26 is a power source 40, which is preferably a 24,000 mAh built-in battery electrically connected to at least one charging port 70. This power source 40 ensures that the smartphone 15 and other accessories, such as the at least one tablet device 16, GoPro® camera, or the like can be powered or charged during use. The power source 40 features an auto power-off function that activates once the devices being charged are at full capacity, conserving energy and protecting the devices. The power source 40 may be configured to provide sufficient power for additional components including integrated speakers and projection systems.

Figure 5:
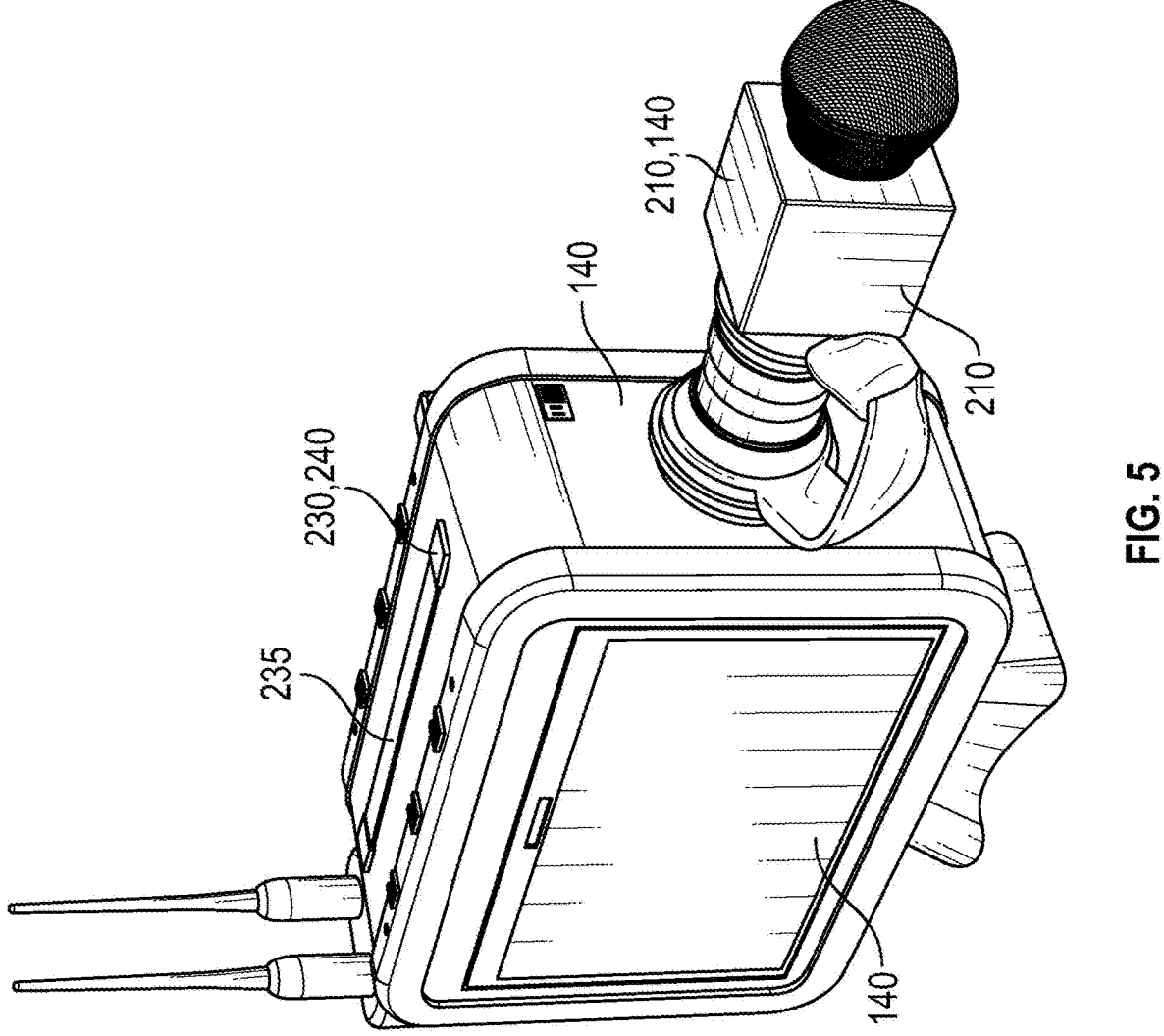
FIG. 5 is a left, front perspective view of the invention, illustrating interchangeable branded panels of the invention.

Projecting away from the container 20 is a mounting bracket 50, specifically configured to hold the smartphone 15 securely. Such a mounting bracket 50 may include an outward projecting mount (as illustrated in the drawings), a sleeve mount (not shown), or magnetic attachment systems (not shown) for the smartphone 15. Such a mounting bracket 50 allows the smartphone 15 to be positioned optimally for video recording or photography. The mounting bracket 50 may also be used to hold a 35 mm camera 17, or the like (FIG. 5). A tripod mount 60, such as a threaded hole 180, is fixed with the bottom side 22 of the container 20, providing stability and allowing the entire system to be mounted on a standard tripod 18, monopod, or the like for steady shots.

The system also includes a microphone mount 80 fixed to the container 20. This microphone mount 80 allows for the attachment of various microphones 100, enabling high-quality audio recording to complement the video captured by the smartphone 15. The microphone mount 80 may also take the form of a charging holster (not shown) that is partially within the storage space 26 of the container 20 and that charges the microphone 100. The microphone mount 80 may also take the form of a standardized camera and videography cold shoe mount 160.

The container 20 may be box-shaped, providing a familiar and recognizable form factor that resembles classic cameras. This box shape also allows for efficient use of the internal storage space 26 and easy attachment of accessories.

The system may include a reel-to-reel magazine container accessory 90 that can be removably attached to the container 20. This accessory 90 is designed to resemble a vintage motion picture film magazine, adding to the overall retro aesthetic while providing additional storage space internally for equipment or props. In some embodiments the reel-to-reel magazine container accessory 90 includes at least one Bluetooth speaker 250 (FIGS. 1 and 3) for karaoke, music amplification, PA applications, or other audio activities. The Bluetooth speaker 250 may be integrated within the reel-to-reel magazine container accessory 90 to maintain the vintage aesthetic while providing modern audio functionality.

The microphone mount 80 may be configured to accept a microphone 100, such as a prop microphone that resembles a classic newscaster microphone. Such a prop microphone 100 can house a functional Bluetooth lavalier microphone, combining vintage aesthetics with modern technology. The microphone 100 may also include a USB outlet 110 that can be electrically connected to the power source 40 when attached to the microphone mount 80, allowing for charging or powering of additional devices. Alternately the microphone 100 may simply be a non-working prop microphone 100 to provide a professional camera aesthetic, in such case another microphone 100 being relied upon for audio (such as a microphone on the smartphone 15 or the tablet device 16, for example).

Figure 4:
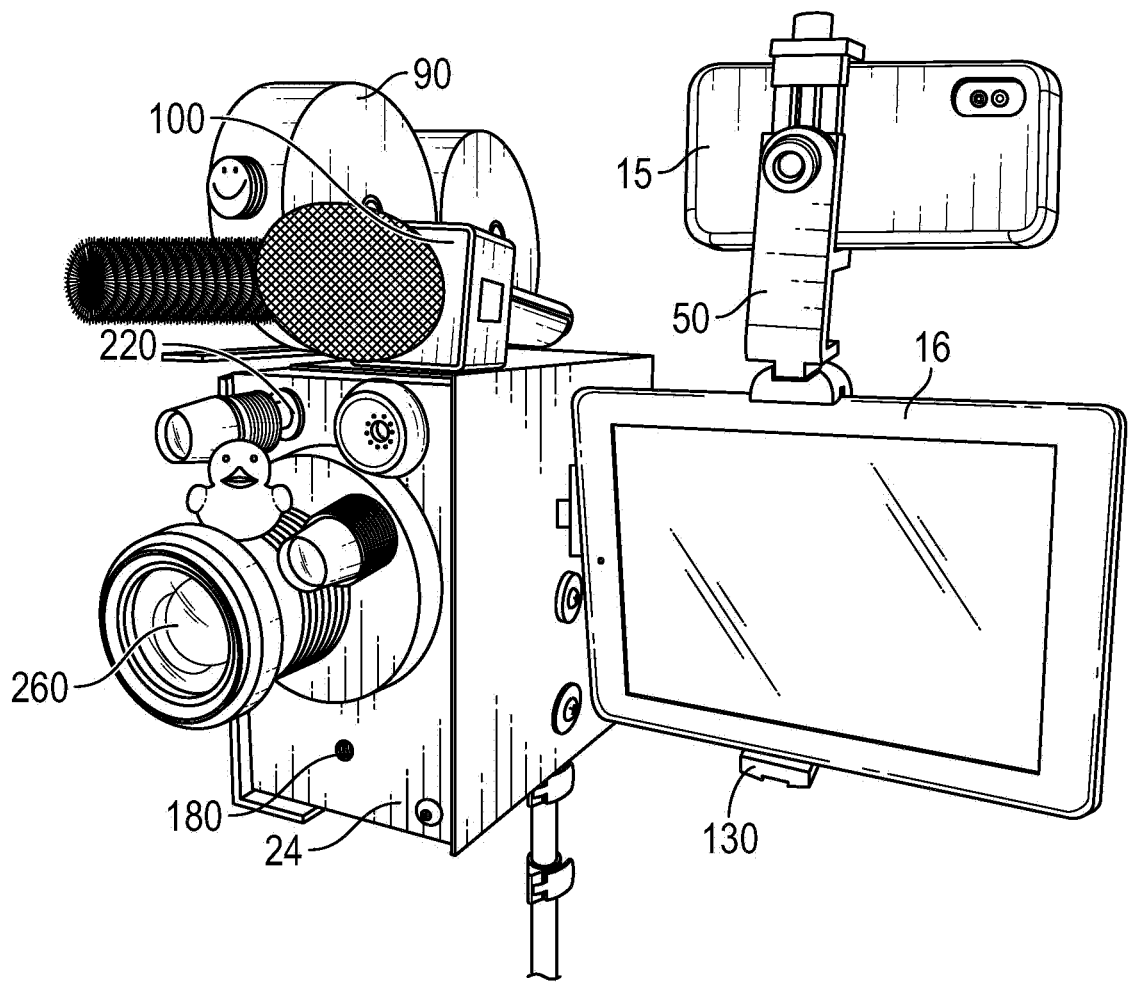
FIG. 4 is a front perspective view of the invention, illustrating a tablet device mounted with a tablet mount.

A detachable lens hood 120 may be included, which can be attached to the container 20 to resemble a motion picture camera lens. This lens hood 120 adds to the vintage camera appearance and can also serve practical purposes such as reducing glare. The detachable lens hood 120 may be configured to accept a teleprompter mirror (not shown) where the tablet device 16 may be mounted horizontally projecting up into the mirror situated to accompany the camera or smartphone 15. The system may include a short-throw projector 260 (FIG. 4) embedded in the lens area, which may be integrated with or positioned near the detachable lens hood 120. The projector 260 may be configured to display karaoke lyrics, video content, or other visual information, and may be powered by the power source 40.

The system may feature at least one tablet mount 130 (FIG. 4) designed to hold the tablet device 16 facing the subject being recorded. Such a tablet mount 130 allows the tablet device 16 to function as a teleprompter, enabling smooth and professional-looking presentations or interviews. Additionally, this setup can be used for Karaoke performances, adding a fun and interactive element to the system's capabilities. Multiple tablet mounts 130 may be included to hold multiple tablet device 16, such that multiple Karaoke singers can each see their own specific lyrics, for example. The system may also include an attachable touch-screen monitor and camera configured for "video booth" self-serve video recording applications, allowing users to record themselves independently.

Interchangeable branded panels 140 may be included, which can be attached to an exterior 29 of the container 20. These panels 140 allow for the display of logos, marks of organizations, QR codes, or the like, making the system customizable for various events or corporate uses. This feature is particularly useful for displaying team logos, TV station branding, or other organizational identities, enhancing the system's appeal for professional and promotional use. The system may include magnetic signage capabilities, allowing for quick and easy attachment and removal of branded panels 140 and other signage elements.

The container and accessory system 10 preferably comprises six sides on which users may mount, attach, connect or link a variety of accessories, including branding logos, badges, and QR codes for promotional purposes, in addition to prop appendages and other containers which may augment the design to resemble classic film or TV cameras, and that may include equipment to enhance lighting, sound, and Bluetooth accessories associated with the smartphone 15.

An LED light accessory 150 may be included, which can be powered by the power source 40 and attached to one of the plurality of mounting points 30. This LED light accessory 150 provides additional lighting options for improved video quality in various environments. The system also supports the use of a 9-volt battery accessory 42 for powering LED lights or illuminating signs, further enhancing its versatility in different lighting conditions.

The system may include a Bluetooth-enabled portable printer 170 stored within the storage space 26 and electrically connected to the power source 40. This printer 170 allows for instant printing of photos or documents, adding versatility to the system's capabilities.

The plurality of mounting points 30 may include at least one standardized camera and videography cold shoe mount 160. This cold shoe mount 160 provides a standard attachment point for various accessories, including the LED light accessory 150 or other camera equipment. In addition to video or camera accessories that mount to the container 20, various mounts, cleats, screw holes, magnets, and Velcro® connection points provide for a plurality of "maker" 3-D printed objects from users who 3D print their own retro-camera looking or functioning parts, branded objects, promotional tools, blinking light kits, and electronically functioning accessories from affiliated websites which provide users a standard, interlocking connection system to configure the container system 10 to create their own desired effect for enhancing smartphone visual and sound recording.

The mounting points 30 may also include at least one threaded hole 180. A prop lens attachment 190 may be included, which can be removably attached to this threaded hole 180, further enhancing the vintage camera appearance.

The system may feature at least one clamp mechanism 200 as part of the mounting points 30 for holding various accessories or branding elements. A flag attachment 210 may be included, which can be removably attached to the microphone 100. The flag attachment 210 can be used for an additional branding element, such as a radio or TV station identifier, or the like.

At least one magnetic attachment point 220 may be included among the mounting points 30. This magnetic attachment point 220 allows for quick and easy attachment of compatible accessories or the removable branded panels 140. The magnetic attachment system may be expanded to accommodate various accessories including microphones, LED lights, prop lenses, and adapters for different camera types such as GoPro cameras and MeVo cameras in addition to smartphones.

The mounting points 30 may include at least one dovetail slot 230. A handle attachment 240 may be provided, which can be removably attached to this dovetail slot 230, offering additional carrying options or stabilization during use with a selectively attachable handle 235.

The camera accessory and storage system 10 is designed to be a comprehensive solution for mobile videography, combining vintage aesthetics with modern functionality. It allows users to transform their smartphones into professional-looking camera setups, complete with various accessories and storage options. The system's versatility makes it suitable for a wide range of applications, including but not limited to parties, special events, vlogging, use in schools, journalism, filmmaking, and sports and marketing companies. From amateur vlogging to professional video production, the Tell-A-Box system maintains a unique and attention-grabbing vintage camera appearance while providing cutting-edge functionality for modern content creation needs.

While a particular form of the invention has been illustrated and described, it will be apparent that various modifications can be made without departing from the spirit and scope of the invention. For example, the container 20 may take a non-rectanguloid shape. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A camera accessory and storage system (10) for use with a smartphone (15), comprising:
   a container (20) resembling a camera, the container including at least one door (24) pivotally attached thereto to provide access to a storage space (26) within the container;
   a plurality of mounting points (30) fixed with the container;
   a power source (40) disposed within the storage space, the power source electrically connected with at least one charging port (70);
   a mounting bracket (50) projecting away from the container and configured for holding the smartphone;
   a tripod mount (60) fixed with a bottom side (22) of the container; and
   a microphone mount (80) fixed with the container;
   whereby the container provides a vintage camera aesthetic while functioning as a versatile mobile videography platform, allowing a user to securely mount the smartphone, attach various accessories via the plurality of mounting points, power devices through the charging port, stabilize the system using the tripod mount, and capture enhanced audio with a microphone attached to the microphone mount, all while storing additional equipment within the container's storage space.

2. The camera accessory and storage system of claim 1, wherein the container is box-shaped.

3. The camera accessory and storage system of claim 1, further comprising a reel-to-reel magazine container accessory (90) removably attachable to the container, wherein the reel-to-reel magazine container accessory resembles a vintage motion picture film magazine and provides additional storage space therewithin.

4. The camera accessory and storage system of claim 1, wherein the microphone mount is configured to accept a prop microphone (100) resembling a classic newscaster microphone, the prop microphone housing a functional Bluetooth lavalier microphone.

5. The camera accessory and storage system of claim 4, wherein the prop microphone includes a USB outlet (110) electrically connected to the power source when the prop microphone is attached to the microphone mount.

6. The camera accessory and storage system of claim 1, further comprising a detachable lens hood (120) configured to attach to the container and resemble a motion picture camera lens.

7. The camera accessory and storage system of claim 1, further comprising a tablet mount (130) configured to hold a tablet device (16) facing a subject being recorded, wherein the tablet device functions as a teleprompter.

8. The camera accessory and storage system of claim 1, further comprising interchangeable branded panels (140) attachable to an exterior (29) of the container for displaying logos or marks of organizations.

9. The camera accessory and storage system of claim 1, further comprising a Bluetooth-enabled portable printer (170) stored within the storage space and electrically connected to the power source.

10. The camera accessory and storage system of claim 1, wherein the plurality of mounting points includes at least one cold shoe mount (160).

11. The camera accessory and storage system of claim 10, further comprising an LED light accessory (150) removably attachable to the cold shoe mount.

12. The camera accessory and storage system of claim 1, wherein the plurality of mounting points includes at least one threaded hole (180).

13. The camera accessory and storage system of claim 12, further comprising a prop lens attachment (190) removably attachable to the threaded hole.

14. The camera accessory and storage system of claim 1, wherein the plurality of mounting points includes at least one clamp mechanism (200).

15. The camera accessory and storage system of claim 14, further comprising a flag attachment (210) removably attachable to the clamp mechanism.

16. The camera accessory and storage system of claim 1, wherein the plurality of mounting points includes at least one magnetic attachment point (220).

17. The camera accessory and storage system of claim 16, further comprising a removable branded panel (140) magnetically attachable to the magnetic attachment point.

18. The camera accessory and storage system of claim 1, wherein the plurality of mounting points includes at least one dovetail slot (230).

19. The camera accessory and storage system of claim 18, further comprising a handle attachment (240) removably attachable to the dovetail slot.

20. The camera accessory and storage system of claim 3, wherein the reel-to-reel magazine container accessory (90) includes at least one Bluetooth speaker (250) integrated therein for karaoke and PA applications.

* * * * *